United States Patent [19]

Forrest et al.

[11] Patent Number: 5,859,866
[45] Date of Patent: Jan. 12, 1999

[54] PHOTONIC INTEGRATION USING A TWIN WAVEGUIDE STRUCTURE

[75] Inventors: Stephen Forrest, Princeton, N.J.; Chih-Ping Chao, Plano, Tex.; Miland Gokhale, Princeton, N.J.; Ligeng Xu, Mountainview, Calif.

[73] Assignee: The Trustees of Princeton University, Princeton, N.J.

[21] Appl. No.: 797,276

[22] Filed: Feb. 7, 1997

[51] Int. Cl.⁶ .............................. H01S 3/19; H01S 3/098; G02B 6/26; G02B 6/10
[52] U.S. Cl. ................... 372/50; 372/19; 385/50; 385/28; 385/29; 385/131; 438/31
[58] Field of Search ................... 385/50, 28, 29, 385/131; 372/50, 45, 19, 20; 438/31, 35; 359/344, 337, 339

[56] References Cited

U.S. PATENT DOCUMENTS

| | | | |
|---|---|---|---|
| 5,140,149 | 8/1992 | Sakata et al. | 372/50 |
| 5,208,878 | 5/1993 | Thulke | 372/50 |
| 5,325,379 | 6/1994 | Amann | 372/50 |
| 5,499,259 | 3/1996 | Makita | 372/45 |
| 5,511,084 | 4/1996 | Amann | 372/50 |
| 5,568,311 | 10/1996 | Matsumoto | 372/46 |

*Primary Examiner*—Rodney B. Bovernick
*Assistant Examiner*—Quyen Phan Leung
*Attorney, Agent, or Firm*—Gibbons, Del Deo, Dolan, Griffinger & Vecchione

[57] ABSTRACT

A monolithically integrated vertical twin-waveguide structure reduces the sensitivity of the device performance characteristics due to the laser cavity length and variations in the layer structure. This is achieved by the introduction of an absorption or loss layer between the active and passive regions. This layer eliminates the propagation of the even mode, while having minimal effect on the odd mode. The threshold current densities and differential efficiencies of the devices are unaffected by the loss layer. A coupling efficiency of 45% from the laser to the external passive waveguide is obtained.

26 Claims, 6 Drawing Sheets

PHOTONIC INTEGRATION USING A TWIN WAVEGUIDE STRUCTURE

FIELD OF THE INVENTION

This invention relates to the field of optical communications devices, and more particularly to photonic integrated circuits.

BACKGROUND OF THE INVENTION

During the past several years, significant advances have been made in improving semiconductor materials and device quality for use in long wavelength communications systems and networks. As a consequence, a new generation of optoelectronic systems and applications is expected to emerge. A precursor to this event is the development of platform integration technology devices using common and simple epitaxial materials, structures and fabrication processes. One such integrated technology platform is Photonic Integrated Circuits ("PIC"), which are often employed for transmitter purposes. PICs generally consist of combinations of active devices and passive devices, such as, lasers and semiconductor optical amplifiers coupled with modulators, couplers and waveguides.

PICs have the potential for producing low cost, high performance, advanced devices for optical communication. An important building block for PICs is a laser coupled to a passive waveguide. This fundamental structure is used for the monolithic integration of lasers with modulators, splitters, and efficient couplers to optical fibers. As known in the prior art, a laser can be integrated with a passive waveguide using a number of different techniques, including regrowth with separate optimization of the two devices, single growth on an etched substrate, disordering of multiple quantum wells ("MQW") to locally change the bandgap, selective area growth enhancement using organometallic vapor phase epitaxy, or evanescent optical field coupling in a vertical twin-waveguide ("TG") structure. Each of these coupling techniques suffer one or more of the following disadvantages: expense, complicated alignment procedures, unacceptable coupling losses or reduced reliability and performance. In particular, the regrowth technology is extremely difficult to control and has numerous problems which must be addressed. For example, one particular concern are the irregular interfaces at the regrown interfaces which can lead to poor device performance and high optical losses between adjoining devices.

Despite the above disadvantages, the vertical TG structure is useful as a versatile platform technology for PICs, since a single epitaxial growth step produces a structure on which a variety of active and passive devices can be fabricated. For example, a prior art TG laser was disclosed consisting of vertically integrated active and passive waveguide layers, which were phase-matched in a manner similar to a directional coupler. Within the past year, another prior art device was fabricated which had a GaAs/AlGaAs-based TG laser integrated with a Y-branch single mode ridge waveguide. A drawback of this latter implementation is the relative inability to control the lasing threshold current and coupling to the passive waveguide resulting from the sensitivity to variations in the device structure itself. The sensitivity variations arise from the interaction between the even and odd modes in the conventional TG structure. Due to this interaction, the fraction of the total optical power incident on the etched facet of the active waveguide is a periodic function of cavity length, which makes it relatively difficult to control the amount of power reflected from the etched facet. Alternatively stated, the interaction of the odd and even modes results in constructive and destructive interference in the laser cavity, which effects a threshold current, modal gain, coupling efficiency and output coupling parameters of the device. This interaction results in devices which are unreliable, unpredictable and expensive to manufacture. Furthermore, the modal gain and coupling length both vary dramatically with changes in the composition and thickness of each layer comprising the device.

Accordingly, there is a serious need to provide a simple and effective device which reduces the sensitivity of the device performance characteristics to laser cavity length, odd/even mode interaction and to the variations in the layered structure. This reliable and easily fabricated device can then be utilized in realizing a highly versatile, platform technology where a variety of active and passive devices can be monolithically fabricated on a single epitaxial wafer structure.

SUMMARY OF THE INVENTION

The present invention teaches a device which reduces the sensitivity of device performance characteristics to laser cavity length, layer structure and composition variations by introducing an absorption layer between an active waveguide and a passive waveguide. This absorption layer or loss layer suppresses lasing on the even mode, thereby making the twin waveguide ("TG") facet reflectivity and coupling efficiency independent of length. This independence permits an easily fabricated and reliable device employable in realizing a highly versatile, platform technology, which can be advantageously utilized in communications systems and networks where a variety of active and passive devices can be monolithically fabricated on a single epitaxial wafer structure. Importantly, the present structure can be employed with any active material which supports lasing capability, since there normally exists an absorptive material capable of acting as a loss layer for the even mode.

In an exemplary embodiment of the present invention, a monolithically integrated device has a twin waveguide structure having an active layer coupled to a passive layer. The present structure advantageously places an absorptive layer between the active and passive layers to eliminate the propagation of the even mode, while having minimal effect on the odd mode. The present invention TG structure provides an easily controllable and versatile device for eliminating modal interaction and thereby increasing coupling efficiency. The resulting threshold current densities and differential efficiencies of the devices are unaffected by the absorption layer. Consequently, the present structure provides reliable and effective mode selectivity without requiring complicated regrowth processing which can result in poor device performance and high optical losses between adjoining devices.

Advantageously, the structure of the present invention achieves optical power transfer independent of the cavity length of the active device. By suppressing lasing on the even mode, the absorptive layer effectively results in optical power transference over the odd mode. The modal interaction elimination by the absorptive layer results in optical power transfer without affecting threshold current, modal gain, coupling efficiency and output coupling. Importantly, the present structure results in a three fold gain in the coupling efficiency from the active layer to the passive layer as opposed to prior art TG devices.

The above factors make the present invention TG structure an advantageous and practical integration platform.

This is further evidenced by the fact, that with only the odd mode present, optical feedback from the etched facet and coupling to the external passive waveguide are decidedly independent of the cavity length and structure variations. Such a twin-guide structure is a significant step toward realizing a highly versatile platform technology where a variety of active and passive devices can be monolithically fabricated on a single wafer structure.

BRIEF DESCRIPTION OF THE DRAWINGS

A more complete understanding of the present invention may be obtained from consideration of the following description in conjunction with the drawings in which.

DETAILED DESCRIPTION

Figure 1A:
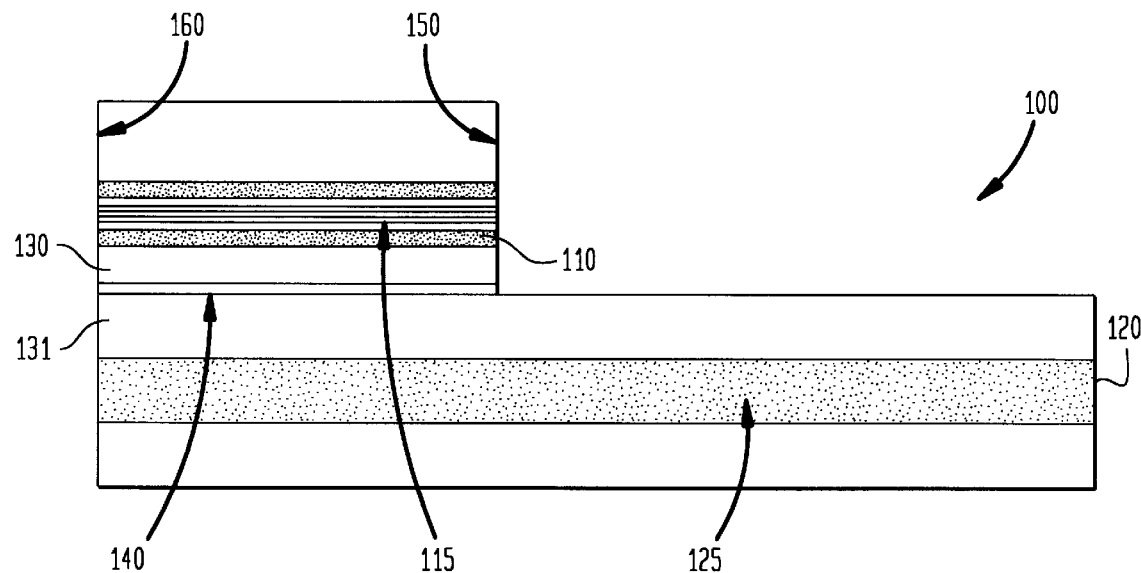
FIG. 1(a) is a schematic cross sectional diagram of an exemplary embodiment of a twin waveguide structure in accordance with the present invention.

The present invention is a device which reduces the sensitivity of device performance characteristics to laser cavity length, layer structure and composition variations by introducing an absorption layer between an active waveguide and a passive waveguide. This absorption layer or loss layer suppresses lasing on the even mode, thereby making the twin waveguide ("TG") facet reflectivity and coupling efficiency independent of length. More importantly, the generality of the solution is such that the present invention structure can be employed with any active material which can support lasing capability, since there generally always exists an absorptive material which can act as a loss layer for the even mode.

The present invention device addresses the problem of interaction between the even and odd modes in a conventional TG structure. In this instance, a TG structure consists of an active layer which is grown above a passive layer, where the active and passive layers are separated by an intermediate layer. As a result of odd and even mode interaction, a fraction of the total optical power incident on an etched facet of the active waveguide is a periodic function of the cavity length, making it extremely difficult to control the amount of power reflected from the etched facet. The interaction of the odd and even modes results in constructive and destructive interference in the laser cavity, which in turn affects the threshold current, modal gain, coupling efficiency and output coupling parameters of the device. As would be understood, the threshold current represents the value above which the laser will lase, the modal gain is the gain achieved by traveling through the medium between the laser facets and the coupling efficiency is the percentage of optical power transference between the active and passive devices.

As in most TG devices, the object is to achieve high coupling efficiency with a low threshold current (or high modal gain). However, this is difficult to realize in current TG structures, due to the odd and even mode interaction. For example, if the odd and even modes were out of phase and the laser cavity length was of the right length, then there would result instances where no power would be output by the device. Alternatively, if the modes were in phase and the laser cavity length again was of the proper length, all or most of the power would be outputted by the device and a high coupling efficiency would be achieved. However, this would result in very low feedback into the laser section and as a consequence, the threshold current would increase.

In general, the present invention structure addresses this problem by placing a thin absorption layer between the active and passive layers. The absorption layer is placed at a position corresponding to where the odd mode has a zero node. The thickness of the absorption layer is chosen such that it introduces a significant amount of loss in the even mode by confining photon emittance, while having minimal effect on the odd mode. By introducing the loss in the even mode, the device suppresses lasing in the even mode, which in turn favors lasing in the odd mode. Thus the even and odd mode interaction is eliminated and the resulting TG structure is not dependent upon cavity length or on composition and layer variations.

Referring to FIG. 1, there is shown a vertical cross-section of an exemplary embodiment of a TG device 100 in accordance with the present invention. TG device 100, which operates at a frequency of $\lambda=1.55$ $\mu$m, has two stacked waveguide layers 110 and 120 separated by a coupling layer 130, 131 (which is also referred to as a spacer layer or a cladding layer). Upper waveguide structure 110 incorporates a multiple quantum well ("MQW") active region 115, and a lower waveguide structure 120 is a passive waveguide 125, and is for example, comprised of a InGaAsP layer. Although in the exemplary embodiment, upper waveguide structure 110 incorporates MQW 115, it could include other similar active regions, such as a semiconductor optical amplifier. In the same manner, lower waveguide 120 could include other similar passive regions, such as a modulator. In addition, although specific materials are referred to in the exemplary embodiment, other elements in the III-V and II-VI groups of the periodic chart of elements are also usable and furthermore, the structures are not limited to quaternary compounds but could include binary and ternary compounds.

TG device 100, for example, is grown in a single epitaxial step on a n-type InP:Si substrate by gas source molecular beam epitaxy ("GSMBE"), and is summarized in Appendix I. In the exemplary embodiment of FIG. 1, active region 115 has three, 13 nm thick, InGaAsP quantum wells separated by a 20 nm InGaAsP barriers with a bandgap of 1.0 eV. Large-bandgap passive waveguide 125, which is a non-absorbing propagating layer, is a 430 nm thick, undoped InGaAsP layer with $E_g=1.0$ eV. Waveguide 110 and waveguide 120 are separated by two 300 nm thick InP coupling layers 130, 131. Coupling layers 130, 131 of TG 100 further include an absorption layer or loss layer 140, which in the exemplary embodiment is a 100 Å thick, undoped $In_{0.53}Ga_{0.47}As$ absorption layer (having an $E_g$ of approximately 0.75 eV) centered between coupling layers 130, 131. Note that loss layer 140 and active region 115 operate at the same frequency.

TG device 100 was designed such that the propagation constants and the QW optical confinement factors for both the even and odd modes were approximately equal. That is, active region 115 and passive region 125 are phase matched. This ensures that both modes propagate at the same velocity, and that the exchange of power between waveguide 110 and waveguide 120 is nearly complete in the absence of loss layer 140. That is, TG device 100 is a symmetric device which achieves a compromise between the two conflicting factors, low threshold current and high output coupling.

Figure 1B:
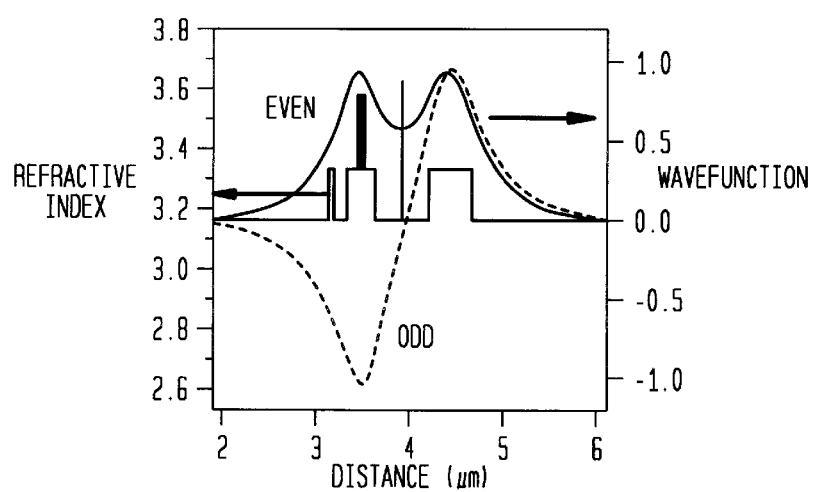
FIG. 1(b) is a graph of the refractive indices and calculated mode profiles of the embodiment shown in FIG. 1(a)

Referring also to FIG. 1(b) in conjunction with FIG. 1(a), the modal intensity and index profile of TG device 100 with a loss layer 140 are shown. As illustrated, at the center of InP layer 130, 131 separating waveguide 110 and waveguide 120, the light intensity of the odd mode is zero while that of the even mode is comparable to the intensity in waveguide 110 and waveguide 120. For a 100 Å thick InGaAs loss layer 140 centered at this point, the confinement factors of the even and odd modes in this layer are calculated to be 0.3% and $4 \times 10^{-4}$%, respectively. Assuming an absorption of $10^4$ $cm^{-1}$ at $\lambda=1.5$ $\mu m$ in $In_{0.53}Ga_{0.47}As$, the loss due to layer 140 for the even and odd modes is 30 $cm^{-1}$ and 0.004 $cm^{-1}$, respectively. Since both modes have approximately the same confinement factor (4.06%, 4.08%) in the active MQW region 115, the odd mode reaches the lasing condition at a lower threshold current and hence will be favored. The intensity of light in both waveguide 110 and waveguide 120 is nearly the same for the remaining odd mode, allowing for an output coupling at etched facet 150 of approximately 50% while maintaining a reasonably low threshold current density.

Several integrated TG laser/waveguide devices having one cleaved facet and a second facet formed by dry etching were fabricated to validate the present invention structure. The device fabrication procedure was as follows. First, the laser region was protected by a ~300 nm thick $SiN_x$ mask, and a reactive ion etching in a 1:7 $CH_4:H_2$ mixture was used to form a smooth vertical laser facet. The facet etch was halted midway between the upper and lower guides, as shown in the scanning electron micrograph in FIG. 2(c). Next, wet etching was used to define the laser and passive waveguide ridges. The passive waveguide was angled at 7° with respect to the cleaved facet to reduce reflections back into the laser cavity. After p- and n-contact metallization, the device with different active region lengths were formed by cleaving the side opposite to the etched facet.

Figure 2A:
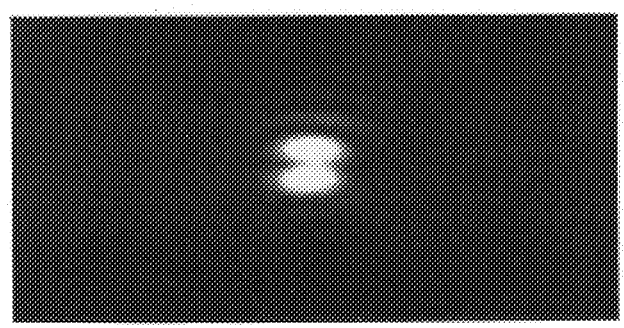
FIG. 2(a) shows the near field optical intensity pattern with absorption layer as observed from the cleaved facet for the embodiment shown in FIG. 1(a)
Figure 2B:
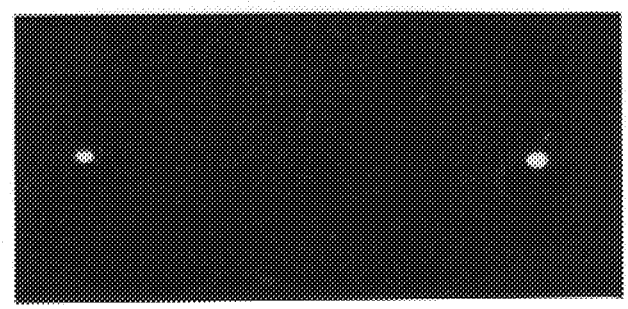
FIG. 2(b) shows the near field pattern of the Y-branch output with absorption layer for the embodiment shown in FIG. 1(a)
Figure 2C:
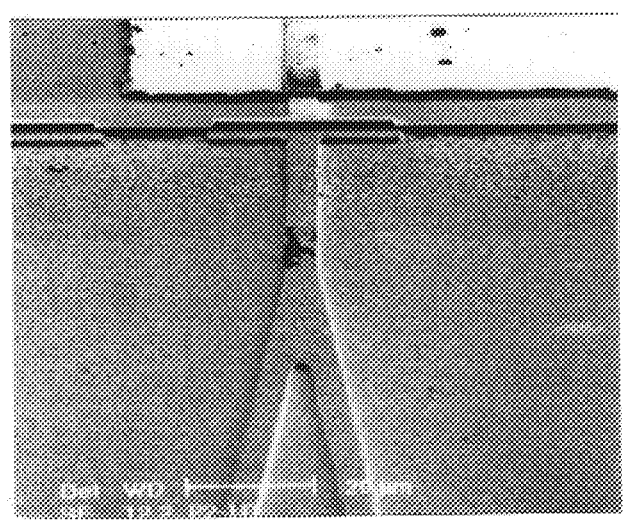
FIG. 2(c) shows the etched facet of the embodiment of FIG. 1(a)

Referring now to FIG. 2(a), the near field pattern from a cleaved facet 160 of TG device 100 with loss layer 140 is shown. The light intensity from the upper and lower waveguides, 110 and 120, respectively, is approximately equal, and the center region is dark as expected for lasing only in the odd mode. Referring now to FIG. 2(b), a near field at the cleaved facet of the passive Y-branch waveguide is shown. Approximately 45% of the light is coupled from laser 115 into passive waveguide 125, as measured using an integrating sphere with the etched facet carefully masked. As would be understood, the integrating sphere is a commonly used device for such measurements. These measurements are in agreement with theoretical calculations, and represents a significant increase in TG coupling compared with a previously reported value of ~13% for a conventional TG device. Note that the theoretical maximum coupling efficiency is 50%. Therefore, a coupling efficiency of 45% represents a 95% coupling realization, whereas the previous TG structures had only a 26% coupling realization.

Figure 3A:
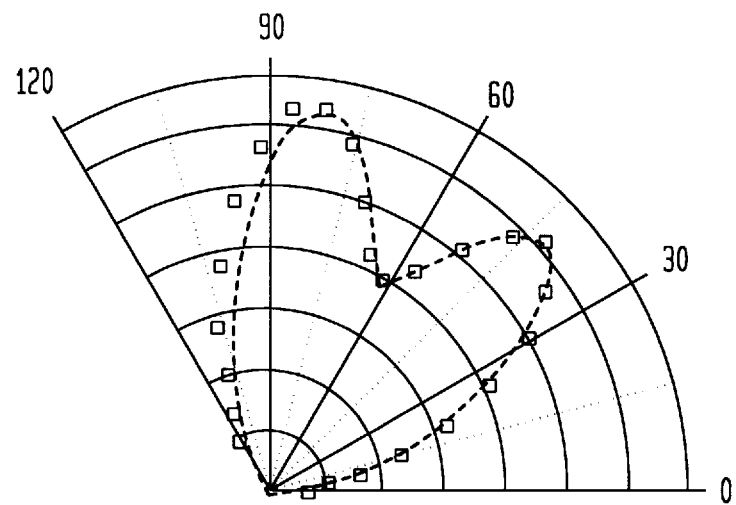
FIG. 3(a) shows the far field pattern of a TG structure without an absorptive layer.
Figure 3B:
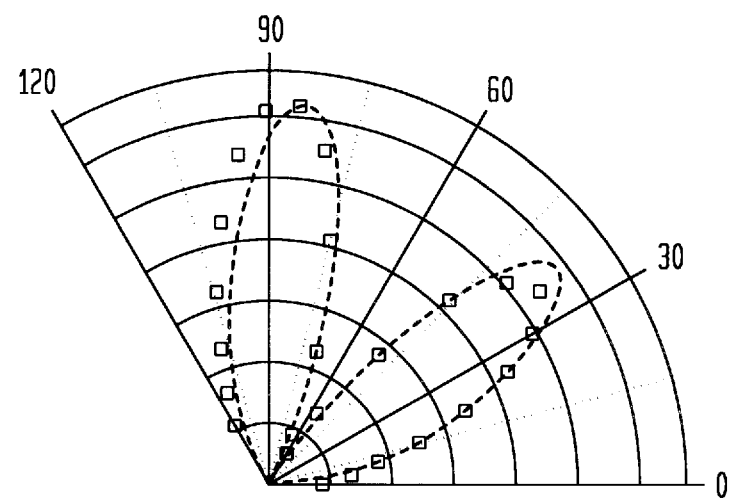
FIG. 3(b) shows the far field pattern with absorption layer of the embodiment of FIG. 1(a)

Referring now to FIG. 3(a), the calculated far-field pattern (represented by the dashed line) is a linear superposition of the odd and even modes. Experimental data clearly shows that without loss layer 140, lasing occurs on both modes. However, for a TG laser with InGaAs loss layer 140, the far-field pattern in FIG. 3(b) matches the calculation made for the odd mode when no contribution from the even mode is expected. This confirms that loss layer 140 eliminates the even mode. As a result, both the coupling efficiency from laser 115 to passive waveguide 125 and the reflection from etched facet 150 are independent of the laser cavity length. The irregular threshold current variation with cavity length in a conventional TG laser (which is a result of odd/even interactions) is completely eliminated using loss layer 140.

Figure 4A:
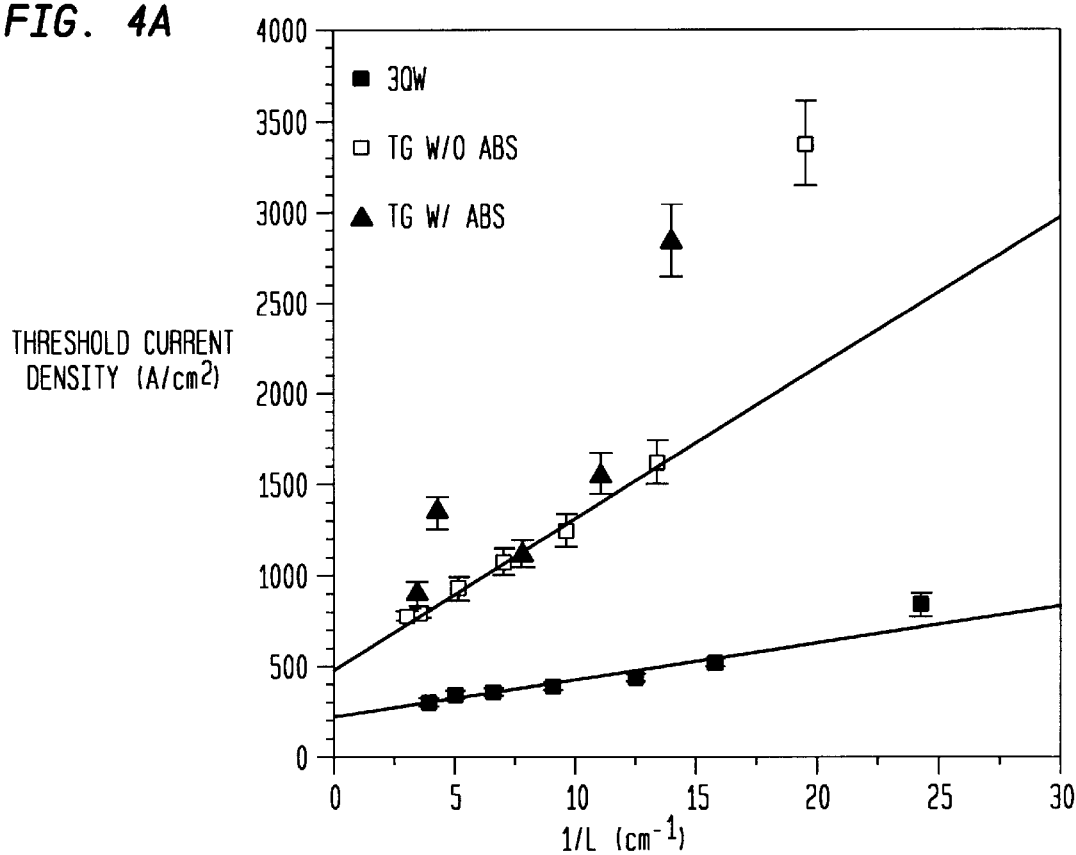
FIG. 4(a) is a graph depicting the threshold current density as a function of cavity length for double cleaved lasers with and without absorption layer.
Figure 4B:
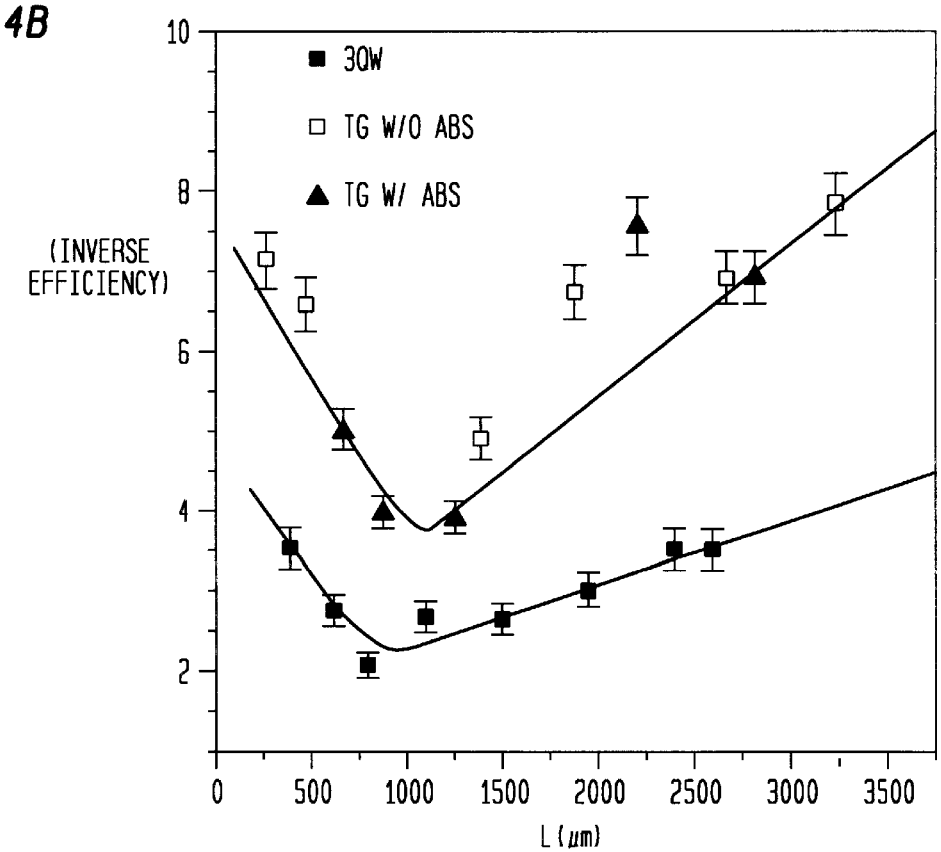
FIG. 4(b) is a graph depicting the inverse efficiency as a function of cavity length for double cleaved lasers with and without absorption layer.

FIGS. 4(a) and 4(b) show the threshold current density and inverse external efficiency versus cavity length with and without a loss layer for another embodiment of the present invention which incorporates double-cleaved (i.e., both facets cleaved) 3QW TG lasers. Also shown for comparison are results for a conventional 3QW, 1.55 $\mu m$ Fabry-Perot laser grown by the same GSMBE process. It can be seen that, within experimental accuracy, the loss layer does not affect the TG laser performance. Note that the minimum threshold current densities of TG lasers are higher than that of Fabry-Perot lasers, since the optical mode in a TG structure spans across both waveguides, and the quantum well confinement factor is correspondingly smaller. From the external efficiency data shown in FIG. 4(b), the internal losses for TG lasers with and without loss layers are similar but are higher than for conventional lasers. This is partly due to the increased free carrier absorption loss in the doped passive waveguide. However, note that in other embodiments it may be less. For TG lasers with a loss layer, a maximum external efficiency of $\eta=25\%$ (L=1.2 mm) and a lowest threshold current density of $J_{TH}=720$ $A/cm^2$ (L=2 mm) was measured, as compared to values for conventional single waveguide lasers of $\eta=50\%$ (L=0.75 mm) and $J_{TH}=250$ $A/cm^2$ (L=2 mm).

Depending on the application, various versions of the doping profiles in the TG structures are possible. For devices without modulators, from top to bottom, the doping profile can be p-contact layer, p-cladding, undoped active region, n-cladding, lightly n-doped/undoped waveguide, n-cladding on n+ substrate. Also an opposite profile on a p+ substrate is possible. For devices with modulators, the doping profile, from top to bottom, can be p-contact layer, p-cladding, undoped active region, n-cladding, lightly n-doped/undoped waveguide, p-cladding on p+ substrate. Also an opposite profile on a n+ substrate is possible. In this version top contacts made to the top-contact layer and the doped cladding layer between the two waveguides and the substrate, can be used to individually bias the modulator and laser.

Figure 5:
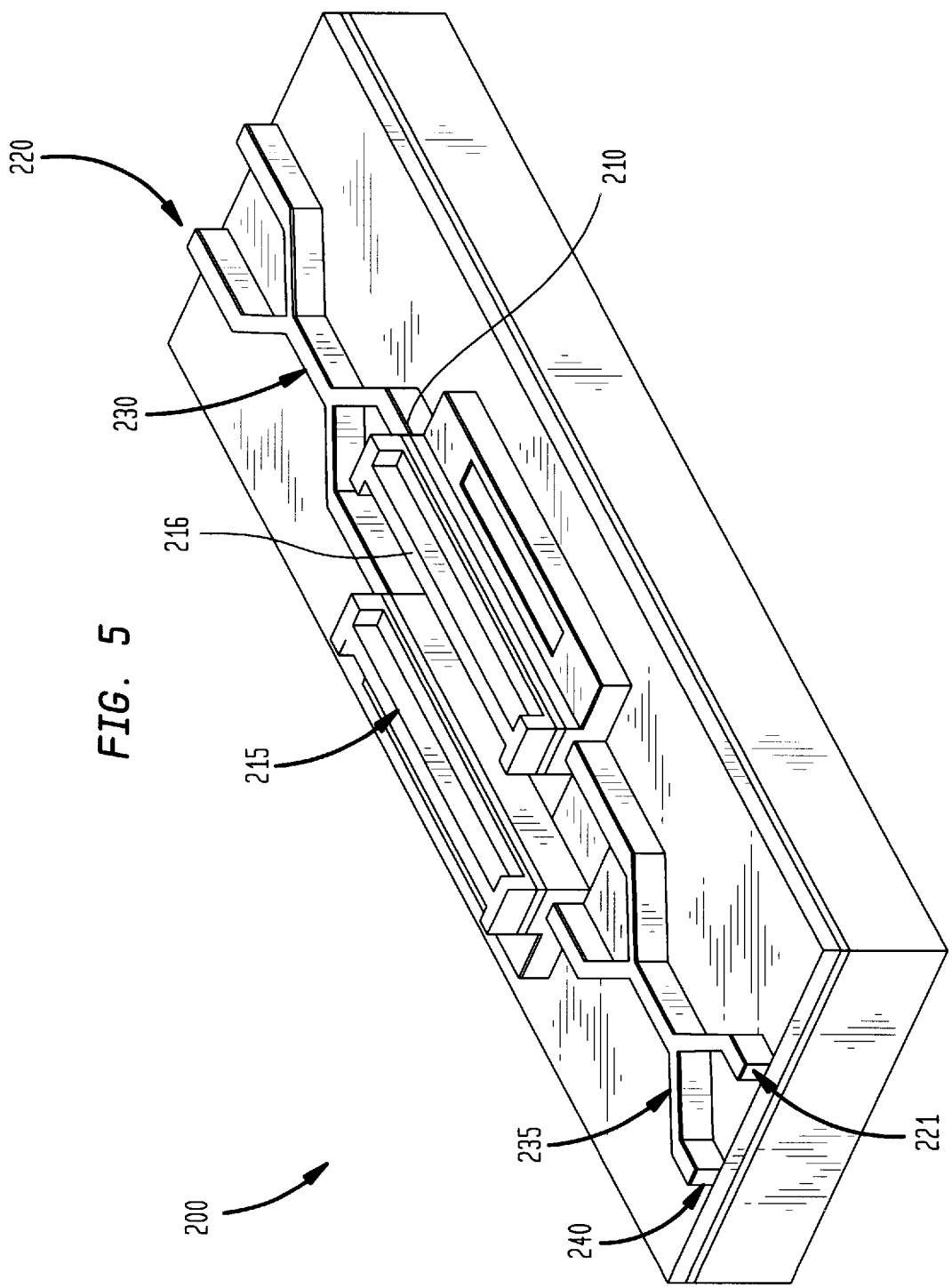
FIG. 5 is an embodiment of a demultiplexer in accordance with the present invention.

An important photonic integrated circuit that can be fabricated using a TG structure is an integrated terahertz optical asymmetric demultiplexer 200 ("TOAD") shown schematically in FIG. 5. TOAD 200 consists of two identical twin-guide based Semiconductor Optical Amplifiers 215, 216 ("SOA") placed asymmetrically in the two branches of a Mach-Zehnder interferometer 210. The input data stream 220, in the form of light pulses, and a control pulse 221 are injected into the interferometer from opposite sides, using 3 dB couplers 230 and 235, respectively. The high intensity control pulse induces optical -non-linearity, resulting in the index change of SOA 215, 216 regions.

Operationally, the structure is designed such that if the signal from the two branched have the same phase, all output goes to the control signal input branch. If the signals from the two branches are out of phase, the output goes to the signal out branch 240. When the time-division multiplexed optical signal and the pulsed control signal are put into two branches of Mach-Zehnder interferometer 210 through 2×2 couplers, the pump beam is so strong that it saturates the SOA region 215, 216 and causes a refractive index change. Since SOA 215, 216 are positioned asymmetrically, the pump signal saturates the SOAs 215, 216 at slightly different times. Thus, within a small time "window", the multiplexed optical signal experiences different index changes in the two branches of the Mach-Zehnder structure. If this difference causes an optical phase difference of $(2m-1)\pi$ where m is an integer, then only the signal in this time window will go to the signal out port 240 and thus be demultiplexed. Outside this time window, the signal still sees two identical branches and goes to the control signal port 221.

The difference between the TG laser and the above mentioned SOA section is in the reflectivity of the facets. The TG laser has high reflection mirrors (formed by etching and/or cleaving and microcleaving), and can be HR coated using metals or dielectrics to improve reflectivity. The SOA section must have AR coated windows (formed by etching and/or cleaving and microcleaving), and can be AR coated using dielectric coatings. Also, to reduce reflectivity the facets can be etched at angle (5–45 degrees, for example) from the perpendicular to the waveguide.

Figure 6:
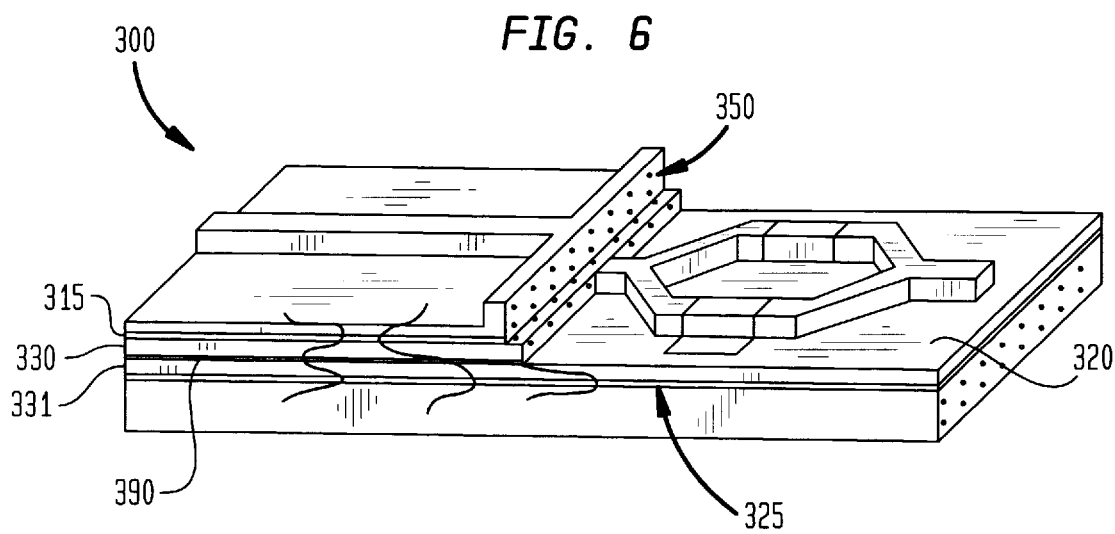
FIG. 6 is an embodiment of a laser/modulator in accordance with the present invention.

Referring now to FIG. 6, a laser and modulator integrated device 300 is shown in accordance with the present invention. In this embodiment, lower passive waveguide 125 of FIG. 1 is replaced with a large waveguide cutoff MQW waveguide section 325. Fabrication of device 300 is grown starting from a p+InP substrate as follows: an 1 $\mu$m thick cladding layer, a InP/InGaAsP MQW waveguide region 325 (approximately 10 periods, waveguide cutoff=1.3 $\mu$m), an undoped InP cladding layer 331 (thickness=0.5 $\mu$m), an InGaAs loss layer 340 (thickness=100 Å), an undoped InP upper cladding layer 330 (thickness=0.5 $\mu$m), an InP/InGaAsP MQW active region 315 (3 to 5 periods, waveguide cutoff=1.55 $\mu$m), p+InGaAsP cladding layer (thickness=0.5 $\mu$m), and a p+InP cap/contact layer. Laser 315 is biased by contacting the top p+InP cap and the lower, n-type cladding layers. To form a modulator 320, the cladding to substrate region is reverse biased. Facets 350 are etched using 1:7 $CH_4$: $H_2$ plasma. The broad front facet shown in FIG. 6 is employed to eliminate damage to the laser ridge termination due to undercut etching. As evident from the illustration, power is transferred via lasing of the odd mode only, as absorption layer 340 suppresses the even mode lasing.

In accordance with the present invention, an InGaAsP/InP, 1.55 $\mu$m waveguide, MQW laser monolithically integrated with a passive waveguide Y-coupler using a vertical twin-guide structure was demonstrated with an absorption layer. It was shown that a loss layer placed between the two waveguides eliminates the even mode while having little effect on the odd mode. With only the odd mode present, optical feedback from the etched facet and coupling to the external passive waveguide are independent of cavity length and structure variations. Such a modified twin-guide structure is an important step toward realizing a highly versatile, platform technology where a variety of active and passive devices can be monolithically fabricated on a single epitaxial wafer structure.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

Appendix 1: Layer structure of twin-guide laser with absorption layer

| Layer Description | Composition | Effective Bandgap (eV) | Layer Thickness (nm) |
|---|---|---|---|
| Substrate | n-InP:S | 1.36 | — |
| n-Cladding | n-InP:Si | 1.36 | 500 |
| Passive Waveguide | p-$In_{0.2}Ga_{0.8}As_{0.44}P_{0.56}$ | 1.0 | 430 |
| Coupling layers | n-InP:Si | 1.36 | 300 |
| Loss layer | $In_{0.53}Ga_{0.47}As$ | 0.77 | 10 |
| Coupling layer | n-InP:Si | 1.36 | 300 |
| Separate Confinement | i-$In_{0.2}Ga_{0.8}As_{0.44}P_{0.56}$ | 1.0 | 113 |
| Active QW region | $In_{0.2}Ga_{0.8}As_{0.7}P_{0.3}$(QW) $In_{0.2}Ga_{0.8}As_{0.44}P_{0.56}$ Barriers | 0.8 (well) 1.0 (barrier) | 3× 13 (well) 20 (barrier) |
| Separate Confinement | i-$In_{0.2}Ga_{0.8}As_{0.44}P_{0.56}$ | 1.0 | 113 |
| p-Cladding | p-InP:Be | 1.36 | 110 |
| Etch-stop layer | p-$In_{0.2}Ga_{0.8}As_{0.44}P_{0.56}$:Be | 1.0 | 51 |
| p-Cladding | p-InP:Be | 1.36 | 1000 |
| p-contact layer | p+-$In_{0.53}Ga_{0.47}As$:Be | 0.75 | 70 |

What is claimed:

1. A monolithically integrated device having a twin waveguide structure, comprising:
    an active region for emitting light upon an application of energy;
    a passive region for propagating said light through said device, said passive region coupled to said active region; and
    an absorption region for eliminating an even mode of propagation, said absorption region being disposed between said active region and said passive region,
    wherein optical power transfer between said active region and said passive region is achieved over an odd mode of propagation.

2. The device according to claim 1, wherein said absorption region has a thickness suitable for overlapping a portion of said even mode such that said even mode is prevented from lasing.

3. The device according to claim 1, wherein said active region and said absorption region operate at a given frequency.

4. The device according to claim 3, wherein said active region and said passive region are phase matched.

5. The device according to claim 3, wherein said twin waveguide structure is substantially symmetric by balancing a threshold current and a model gain with a coupling efficiency.

6. The device according to claim 1, wherein said active region is at least one multiple quantum well.

7. The device according to claim 1, wherein said active region is a laser.

8. The device according to claim 1, wherein said active region is a semiconductor optical laser.

9. The device according to claim 1, wherein said passive region is at least one multiple quantum well.

10. The device according to claim 1, wherein said passive region is a Y-branch waveguide.

11. The device according to claim 1, wherein passive region is selected from the group consisting of a splitter, coupler and a modulator.

12. The device according to claim 1, wherein:

a first coupling region separates said active region from said absorption region; and a second coupling region separates said absorption region from said passive region.

13. The device according to claim 12, wherein said device is fabricated in a single epitaxial step.

14. The device of claim 1, wherein said absorption region is placed at a zero mode of said odd mode.

15. A photonic integrated circuit having a twin waveguide structure, wherein optical power is transferred in said twin waveguide structure by propagation of an even mode and an odd mode, said circuit comprising:

an active element for emitting light upon an application of energy;

a passive element for propagating said light through said circuit, said passive element coupled to said active element; and a modal selection element for preventing lasing in said even mode and favoring lasing in said odd mode, such that said optical power is transferred over said odd mode, said modal selection element being disposed in a position corresponding to a zero node of said odd mode.

16. The circuit according to claim 15, wherein said modal selection element has a thickness suitable to confine photons in said even mode such that said even mode is prohibited from lasing.

17. The circuit according to claim 15, wherein said active element is a laser;

a first cladding element separating said active element from said modal selection element;

a second cladding element for separating said modal selection element from said passive element; and said passive element is a passive waveguide.

18. The circuit according to claim 17, wherein propagation constants and optical confinement factors are approximately equal for said even mode and said odd mode.

19. The circuit according to claim 15, wherein said active element is a semiconductor optical element; and said passive element is a multiple quantum well waveguide.

20. The circuit according to claim 15, wherein said active element is a multiple quantum well laser; and said passive element is a multiple quantum well waveguide.

21. A monolithically integrated device utilizing a twin waveguide structure on a substrate, said device comprising:

an active layer for radiating photons in response to an application of energy;

a passive layer for forwarding said photons through said device, said passive layer overlying said substrate;

a loss layer for confining a suitable portion of an even mode of propagation in said device, wherein an odd mode of propagation is utilized for optical power transfer between said active layer and said loss layer;

said active layer being vertically stacked over said passive layer; and said loss layer being centered between said active layer and said passive layer.

22. The device of claim 21, wherein said loss layer is placed at a zero node of said odd mode.

23. The device of claim 22, wherein said suitable portion prevents lasing in said even mode.

24. The device of claims 21, wherein:

said active layer is selected from a group consisting of a multiple quantum well laser and a semiconductor optical amplifier; and said passive layer is selected from a group consisting of a multiple quantum well waveguide, splitter, and a coupler.

25. A method for fabricating a photonic integrated device having a twin waveguide structure, comprising the steps of:

applying a passive layer on a substrate;

applying a first spacer layer on said passive layer;

applying an absorption layer on said first spacer layer, said absorption layer prohibiting lasing of an even mode propagating in said device;

applying a second spacer layer on said absorption layer; and applying an active layer on said second spacer layer.

26. The method of claim 25, wherein said absorptive layer is of a suitable thickness to confine photons in said even mode.

* * * * *